United States Patent
Masuda et al.

(10) Patent No.: US 12,438,115 B2
(45) Date of Patent: Oct. 7, 2025

(54) POWER SEMICONDUCTOR MODULE

(71) Applicant: Hitachi Power Semiconductor Device, Ltd., Hitachi (JP)

(72) Inventors: Toru Masuda, Tokyo (JP); Seiichi Hayakawa, Hitachi (JP); Yuji Takayanagi, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 386 days.

(21) Appl. No.: 17/625,815

(22) PCT Filed: Apr. 6, 2020

(86) PCT No.: PCT/JP2020/015565
§ 371 (c)(1),
(2) Date: Jan. 10, 2022

(87) PCT Pub. No.: WO2021/014692
PCT Pub. Date: Jan. 28, 2021

(65) Prior Publication Data
US 2022/0302075 A1 Sep. 22, 2022

(30) Foreign Application Priority Data
Jul. 19, 2019 (JP) ................ 2019-133942

(51) Int. Cl.
*H01L 23/049* (2006.01)
*H01L 23/00* (2006.01)
(Continued)

(52) U.S. Cl.
CPC ........... *H01L 24/48* (2013.01); *H01L 23/049* (2013.01); *H01L 23/3735* (2013.01);
(Continued)

(58) Field of Classification Search
CPC ......... H01L 24/48; H01L 24/32; H01L 24/73; H01L 24/49; H01L 2224/48096;
(Continued)

(56) References Cited

U.S. PATENT DOCUMENTS

2001/0003050 A1\* 6/2001 Onozawa ............ H01L 21/8252
438/587
2002/0195286 A1\* 12/2002 Shirakawa ......... H05K 7/14329
257/E23.079
(Continued)

FOREIGN PATENT DOCUMENTS

JP 2004-289103 A 10/2004
JP 2007-234690 A 9/2007
(Continued)

OTHER PUBLICATIONS

International Search Report, mailed Jul. 7, 2020, for International Application No. PCT/JP2020/015565.
(Continued)

*Primary Examiner* — Teresa M. Arroyo
(74) *Attorney, Agent, or Firm* — Baker Botts L.L.P.

(57) ABSTRACT

There is provided a power semiconductor module with multiple semiconductor chips arranged in parallel on an insulated substrate, allowing for high density mounting of semiconductor chips and highly reliable with less difference in operating characteristics from one semiconductor chip to another. The above module includes an insulated substrate; a first conductive pattern laid out on the insulated substrate; multiple power semiconductor chips arranged on the first conductive pattern; a first wiring formed to bridge and directly connecting respective gate electrodes of the power semiconductor chips; and a second wiring formed to bridge and directly connecting respective source electrodes of the power semiconductor chips, wherein the first wiring is
(Continued)

placed alongside of the second wiring and may be angled within 30 degrees with respect to the second wiring.

10 Claims, 10 Drawing Sheets

(51) Int. Cl.
*H01L 23/373* (2006.01)
*H01L 25/07* (2006.01)

(52) U.S. Cl.
CPC .............. *H01L 24/32* (2013.01); *H01L 24/73* (2013.01); *H01L 25/072* (2013.01); *H01L 2224/32225* (2013.01); *H01L 2224/48139* (2013.01); *H01L 2224/48175* (2013.01); *H01L 2224/73265* (2013.01); *H01L 2924/10272* (2013.01); *H01L 2924/13091* (2013.01); *H01L 2924/30107* (2013.01)

(58) Field of Classification Search
CPC . H01L 2224/49111; H01L 2224/49113; H01L 2224/49175; H01L 2224/0603; H01L 2224/49431; H01L 2224/49433; H01L 2224/32225; H01L 2224/48139; H01L 2224/48175; H01L 2224/73265; H01L 2924/19107; H01L 2924/30107; H01L 2924/10272; H01L 2924/13091; H01L 23/049; H01L 23/3735; H01L 25/072; H01L 2224/48227; H01L 2924/00012; H02M 1/088; H02M 7/003
See application file for complete search history.

(56) References Cited

U.S. PATENT DOCUMENTS

| | | |
|---|---|---|
| 2004/0248330 A1 | 12/2004 | Kitabatake et al. |
| 2007/0235766 A1* | 10/2007 | Kojima ............... H01L 27/0207 257/E27.07 |
| 2008/0048777 A1* | 2/2008 | Kohjiro ............. H01L 23/49844 330/250 |
| 2013/0082284 A1* | 4/2013 | Okumura ................ H01L 24/46 257/77 |
| 2015/0155797 A1* | 6/2015 | Okayama ................ H01L 24/49 363/131 |
| 2015/0207429 A1* | 7/2015 | Akiyama ................ H01L 24/49 363/131 |
| 2015/0221626 A1 | 8/2015 | Motowaki et al. |
| 2016/0294379 A1* | 10/2016 | Hayashiguchi ..... H02M 7/5387 |
| 2016/0308523 A1* | 10/2016 | Otake ................. H01L 29/7805 |
| 2019/0097043 A1 | 3/2019 | Tominaga et al. |
| 2020/0185359 A1 | 6/2020 | Nakashima et al. |

FOREIGN PATENT DOCUMENTS

| | | |
|---|---|---|
| JP | 2010-087400 A | 4/2010 |
| JP | 2015-142059 A | 8/2015 |
| JP | 2019-068035 A | 4/2019 |
| WO | WO 2019/044748 A1 | 3/2019 |

OTHER PUBLICATIONS

International Preliminary Report on Patentability, dated Feb. 1, 2021, for International Application No. PCT/JP2020/015565.

* cited by examiner

POWER SEMICONDUCTOR MODULE

TECHNICAL FIELD

The present invention relates to a power semiconductor module structure and, particularly, to a technology effectively applicable to SiC power semiconductor modules using a SiC substrate.

BACKGROUND ART

Power converters are used to control electric power and motor operation in industrial equipment, electric railroad vehicles, hybrid motor vehicles, electric motor vehicles, etc. A power converter is comprised of, inter alia, electric parts such as power semiconductor modules and capacitors, wiring components to interconnect the electric parts, and heat sinks to dissipate heat generated by power loss of the electric parts.

Heretofore, for power converters, it has been demanded continuously to reduce their volume and weight. For example, in the case of electric motor vehicles, size reduction of power converters can lead to improvements; e.g., mounting new electric parts such as storage batteries in a space made available by the size reduction of power converters will improve an added value such as extension of millage or expanding the interior space for passengers will improve passenger comfort. Hence, for power semiconductor models as power converter components, it is demanded to reduce their volume, even while increasing their rated current value. Volume reduction is required for heat sinks as well.

One of means for meeting the demand to reduce size of these main electric parts is applying compound semiconductor chips made of SiC (silicon carbide) or GaN (gallium nitride) to power semiconductor modules. In comparison with conventionally used semiconductor chips using Si (silicon), the compound semiconductor chips have the following advantages: high switching speed and, in addition, higher upper limit temperature of operating temperature among others. Switching related loss can be decreased by high speed operation and, moreover, it is possible to hold down heat dissipation performance, since the compound semiconductor chips are operable at higher temperature. Therefore, there is an advantage that heat sinks can be designed to have a smaller volume.

On the other hand, the chip yield of these compound semiconductor chips is lower than that of Si semiconductor chips, because of crystal defects originating from a substrate and manufacturing process issues. Therefore, the external dimensions as chip size of compound semiconductor chips are set smaller to improve the yield. Accordingly, in order to configure a power semiconductor module satisfying a predetermined rated current, it is required to mount multiple compound semiconductor chips being connected in parallel on an insulated substrate within the module.

As background art in the technical field of the present invention, for example, there is a technology as in PTL 1. PTL 1 discloses "a structure in which multiple pieces of transistor elements 4 and diode elements 31 are arranged in parallel on an insulated substrate 2" (FIG. 5). On the surface of the insulated substrate 2, wiring patterns below are arranged in place: a wiring pattern 3B connecting the collector electrodes (or drain electrodes) of the multiple transistor elements 5 with the cathode electrodes of the diode elements 31; in addition, a wiring pattern 3A connecting the emitter electrodes (or source electrodes) of the respective transistor elements 31 with the anode electrodes of the diode elements 31 via connection terminals 36; a wiring pattern 3C connecting the gate electrodes of the respective transistor elements 31; and a wiring pattern 3D for source sense wiring which is paired with gate electrode wiring.

Also, PTL 2 discloses "a wiring structure for making multiple segments 1 operate in parallel, the structure in which a connection wiring 7 formed to bridge each electrode pad using a wire (made of aluminum) is used to make connection among the pads of gate electrodes of the multiple segments 1 and the gate electrode pads of three segments 1 are connected to a gate electrode terminal 43" (FIG. 1 therein). By connecting the multiple gate electrode pads of the segments 1 together to the gate electrode terminal 43, an area required to be occupied the gate electrode terminal 43 is decreased.

CITATION LIST

Patent Literature

PTL 1: Japanese Patent Application Laid-Open No. 2015-142059
PTL 2: Japanese Patent Application Laid-Open No. 2004-289103

SUMMARY OF INVENTION

Technical Problem

Compound semiconductor chips, the introduction of which into power semiconductor modules is advanced, have smaller external dimensions as chip size than conventional chips made of Si in order to improve the yield. A first problem is enabling it to mount a larger number of power semiconductor chips on the power semiconductor chip mounting substrate as compared with prior art.

In order to reduce the size of a power semiconductor module or increase the number of power semiconductor chips to be mounted within the module, it is effective to make connection among the gate electrodes of multiple power semiconductor chips that are mounted on the power semiconductor chip mounting substrate by wiring formed to bridge each electrode pad as in PTL 2 mentioned above.

Meanwhile, to take full advantage of performance of power semiconductor chips, a gate drive voltage that is observed at a gate driving terminal of a power semiconductor module has to follow, without differing from, the waveform of the gate drive voltage for the power semiconductor chips mounted in the power semiconductor module.

If the gate drive voltage has followability as above, it is enabled to set the gate drive waveform at high speed or at a voltage as large as possible, while suppressing a noise voltage which is produced by switching within a rated gate voltage range of the power semiconductor chips and it is possible to take full advantage of performance of the power semiconductor chips.

In the structure according to PTL 2 mentioned above, due to a noise voltage which is produced with switching, a difference arises between the gate drive voltage that is observed at a gate driving terminal of a power semiconductor module and the waveform of the gate drive voltage for the power semiconductor chips mounted on the substrate within the module.

Compound semiconductor chips have the advantages of smaller equivalent resistance during conduction and smaller switching related loss than conventional chips made of Si. However, it is required to drive the gates properly in order to allow the power semiconductor module to take those advantages. A second problem is decreasing the difference between the gate drive voltage that is observed at the gate driving terminal of the power semiconductor module and the waveform of the gate drive voltage for the power semiconductor chips mounted in the power semiconductor module in contrast to the prior art.

In the structure according to PTL 2 (FIG. 5) mentioned above, the percentage of the area occupied by the semiconductor elements such as the transistor elements 4 and the diode elements 31 throughout the insulated substrate is 50% or below and the surface mounting efficiency of the semiconductor elements is low. As noted previously, it is required to improve the surface mounting efficiency in order to configure a smaller power semiconductor module satisfying a predetermined rated current. It is desired to reduce the areas of the patterns, e.g., the wiring patterns 3A, 3C, and 3D.

In the structure according to PTL 2 (FIG. 1) mentioned above, controllability of the gate drive voltage becomes a problem. According to PTL 2, a source electrode terminal 41 through which a large source current passes is also used as an input terminal for a control reference signal as a gate control signal. Consequently, due to impedance of a path through which a main current passes when switching occurs, a noise voltage is superimposed on the gate drive voltage between the gate electrode terminal 43 and the source electrode terminal 41. Impedance that causes the noise voltage is generated by the connection wiring (wire) 6 formed to bridge each electrode pad and the wiring pattern for the source electrode terminal 41.

While the voltage between the gate electrode terminal 43 and the source electrode terminal 41 can be measured as a terminal voltage of the power semiconductor module, it appears as a transient response waveform that is different from the gate drive voltage between the gate and source electrodes of the power semiconductor chips within the power semiconductor module.

In other words, because a difference arises between the gate drive voltage appearing at a terminal of the power semiconductor module and the gate drive voltage for the power semiconductor chips within the power semiconductor module, controllability of the gate drive voltage of the power semiconductor module is poor and it can be said that there is difficulty in driving the power semiconductor chips to operate at maximum performance within the rated voltage and current ranges.

Therefore, an object of the present invention resides in providing a power semiconductor module in which multiple semiconductor chips are arranged in parallel on an insulated substrate, wherein the above module allows for high density mounting of semiconductor chips and is highly reliable with less difference in operating characteristics from one semiconductor chip to another.

Solution to Problem

To solve the problems noted above, a power semiconductor module includes an insulated substrate; a first conductive pattern laid out on the insulated substrate; multiple power semiconductor chips arranged on the first conductive pattern; a first wiring formed to bridge and directly connecting respective gate electrodes of the multiple power semiconductor chips; a second wiring formed to bridge and directly connecting respective source electrodes of the multiple power semiconductor chips; a gate control terminal electrically insulated from the first conductive pattern and situated on a casing; and a source sense control terminal separating away from the first conductive pattern and situated on the casing, wherein the first wiring is placed alongside of the second wiring and may be angled within 30 degrees with respect to the second wiring, and is connected to the gate control terminal without connection via any other conductive pattern on the insulated substrate, and that the second wiring is connected to the source sense control terminal without connection via any other conductive pattern on the insulated substrate.

Advantageous Effects of Invention

According to the present invention, it is possible to realize a power semiconductor module in which multiple semiconductor chips are arranged in parallel on an insulated substrate, wherein the above module allows for high density mounting of semiconductor chips and is highly reliable with less difference in operating characteristics from one semiconductor chip to another.

Consequently, both size reduction and reliability improvement of power converters are achievable.

Problems, structures, and advantageous effects other than described above will be made apparent from the following description of embodiments.

BRIEF DESCRIPTION OF DRAWINGS

FIG. 1 is a diagram depicting an internal structure of a power semiconductor module pertaining to Example 1 of the present invention.

DESCRIPTION OF EMBODIMENTS

In the following, examples of the present invention are described with the aid of the drawings. In the respective drawings, identical components are assigned identical reference designators and detailed description thereof, regarded as duplicative, is omitted.

Example 1

A power semiconductor module of Example 1 of the present invention is described with reference to FIGS. 1 to 8.

This example illustrates with an example that the present invention can concurrently achieve the following: 1) the invention can improve the efficiency of mounting multiple power semiconductor chips on a power semiconductor chip mounting substrate (the main substrate) that is incorporated in the power semiconductor module; and 2) the invention can improve the gate controllability by reducing a noise voltage that is superimposed on a voltage Vgs between a gate control terminal and a source control terminal of the power semiconductor module when switching occurs.

By making an observable transient response waveform of the voltage Vgs between the gate and source control terminals approximate to a voltage Vgschip that is applied to between the gate and source electrodes of power semiconductor chips mounted within the power semiconductor, it is possible to know the behavior of the Vgschip voltage when switching occurs and assess an operation margin with respect to the rated voltage of Vgschip and an operation margin with respect to malfunction.

As a result, the main voltage and the rate of change over time of the main voltage when switching occurs (dv/dt and di/dt) can be set highest possible in an operation range of the power semiconductor module without exceeding the rated voltage and suffering from malfunction.

For example, supposing that a noise voltage is superimposed on Vgs, a less margin with respect to the rated voltage should be estimated in comparison with an actual transient waveform of Vgschip. Because the dv/dt and di/dt settings have to be set smaller, a problem of increase in switching loss arises.

Figure 5:
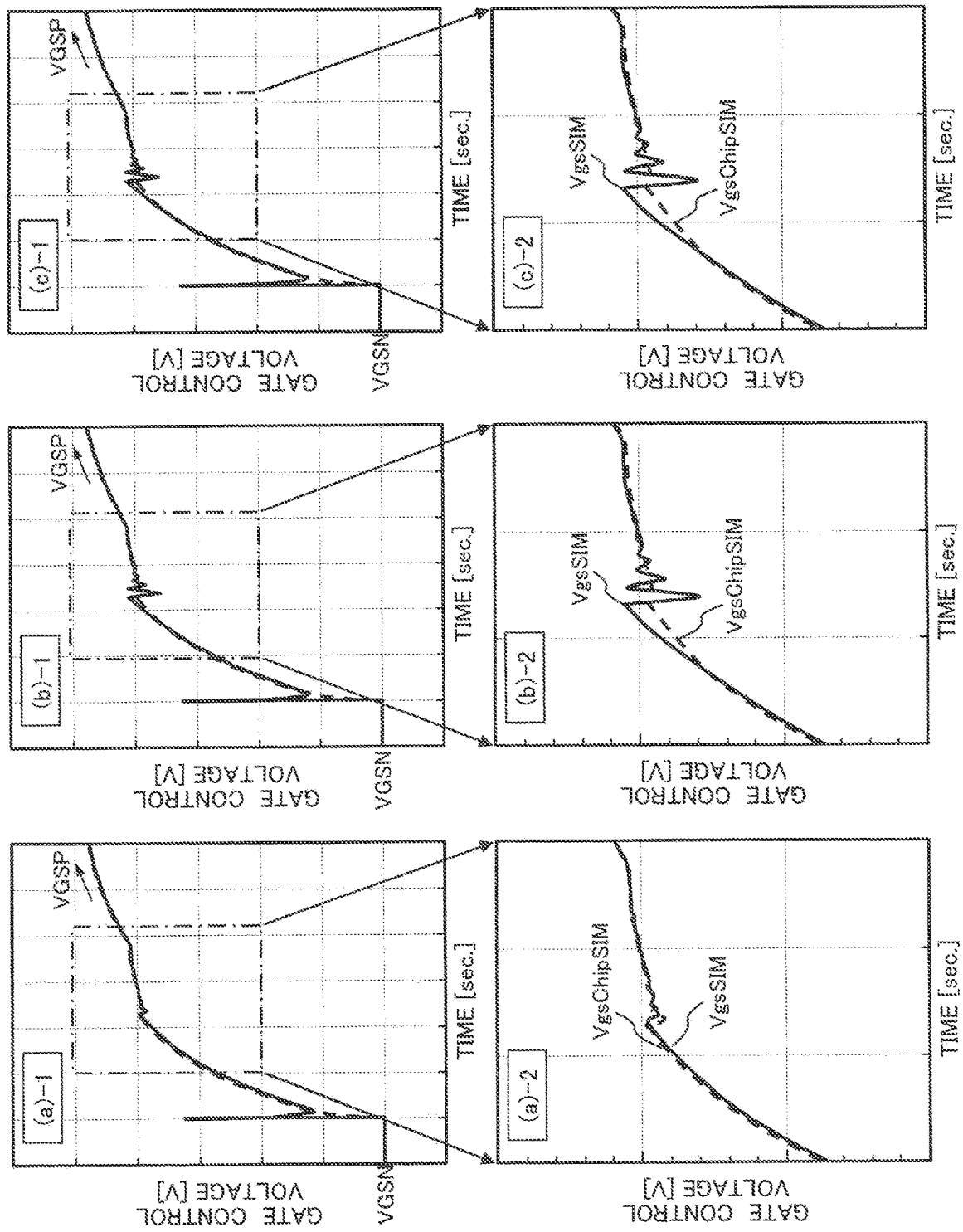
FIG. 5 is a set of diagrams illustrating an example of advantageous effects of the present invention.

First, arrangement of multiple power semiconductor chips that are mounted on the power semiconductor chip mounting substrate (main substrate) is described. When arranging power semiconductor chips on the insulated substrate (chip mounting substrate), it is required to ensure insulation distance between chips and form gate control wiring of switching element chips (the description here takes MOSFET chips for example). In FIG. 5 of PTL 1 mentioned previously, provided are the wiring pattern 3C as a gate control wiring pattern and the wiring pattern 3D as a source control wiring pattern to which surface areas of the insulated substrate (chip mounting substrate) 2 are allocated.

Figure 1A:
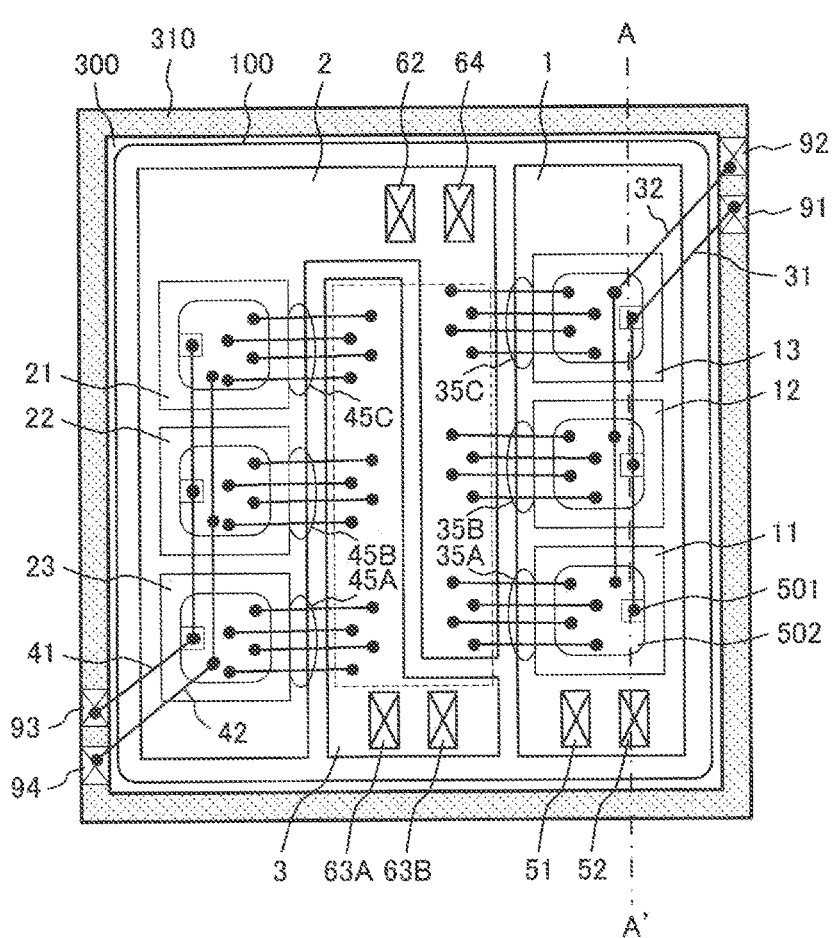
FIG. 1A is a top view and FIG. 1B is a cross-section view cut along the line A-A' in FIG. 1A.

FIG. 1 depicts an internal structure of the power semiconductor module of the present example; (a) is a top view and (b) is a cross-sectional view cut along the line A-A' in (a). FIG. 1 is the internal structure of a 2in1 module in which MOSFET type power semiconductor chips are mounted. One power semiconductor chip mounting substrate 100 is placed over a base plate 300 with a solder joint layer 9 being put therebetween. On the power semiconductor chip mounting substrate 100, power semiconductor chips for an upper arm of the 2in1 module and power semiconductor chips for a lower arm are mounted together.

A drain 1 terminal 51 which is a high potential terminal (P terminal) of the 2in1 module is connected to a drain 1 feed point 51 of the power semiconductor chip mounting substrate 100. A drain 2 terminal 64 which is an intermediate potential terminal (AC terminal) is connected to a drain 2 feed point 64 of the power semiconductor chip mounting substrate 100. Source 2 terminals 63 (63A, 63B) which are low potential terminals (N terminals) are connected to source 2 feed points 63 (63A, 63B) of the power semiconductor chip mounting substrate 100.

A gate 1 control terminal 91 which is a control terminal controlling gates in the upper arm of the power semiconductor module is connected via a bonding wire 13 to a gate electrode of a power semiconductor chip 13 that is mounted on the power semiconductor chip mounting substrate 100. A source sense 1 control terminal 92 in the upper arm is connected via a bonding wire 32 to a source electrode of the power semiconductor chip 13.

Similarly, a gate 2 control terminal 93 in the lower arm is connected via a bonding wire 41 to a gate electrode of a power semiconductor chip 23 that is mounted on the power semiconductor chip mounting substrate 100. Also, a source sense 2 control terminal 94 in the lower arm is connected via a bonding wire 42 to a source electrode of the power semiconductor chip 23.

A drain sense 1 control terminal 52 is connected to a drain sense 1 feed point 52 and a drain sense 2 control terminal 62 is connected to a drain sense 2 feed point 62; these terminals are used for observing a drain voltage in the upper and lower arms. In the way described above, the terminals of the power semiconductor module are electrically connected with the terminals of the power semiconductor chip mounting substrate 100.

Note that, although several terminals of drain 1, drain sense 1, drain 2, drain sense 2, and source 2 are not depicted in FIG. 1, these terminals are conductive terminals that are electrically connected with feed points of the power semiconductor chip mounting substrate 100 and it goes without saying that they have sufficient voltage withstanding and current withstanding abilities against voltage that is applied to between the terminals and a current that passes through them.

The power semiconductor chip mounting substrate 100 is provided with a drain 1 having a conductive pattern 1 (a pattern for applying high potential P), a drain 2 having a conductive pattern 2 (a pattern for applying intermediate potential AC), and a source 2 having a conductive pattern 3 (a pattern for applying low potential N) on one side of the insulated substrate 99 and is provided with a back-side conductive pattern 5 on the other side.

The drain 1 conductive pattern 1 should be formed such that the pattern electrically connects with drain electrodes provided on the back sides of multiple power semiconductor chips 11 to 13 of a vertical structure with solder joint layers 10 being put between the pattern and each electrode and, furthermore, can make connection with the drain 1 terminal 51 of the power semiconductor module and the drain 1 control terminal 52 that is used for potential observation.

A current passing through the power semiconductor chips 11 to 13 for the upper arm flows from the source electrode pads 502 of the power semiconductor chips 11 to 13 via multiple bonding wires 35A, 35B, 35C to the drain 2 conductive pattern 2 placed on the power semiconductor chip mounting substrate 100. Because a large current ranging from several hundreds to thousands of amperes flows through the drain 1 conductive pattern 1, the drain 2 conductive pattern 2, and the source 2 conductive pattern 3, the cross-sectional area of the conductive patterns is designed to a value to prevent the patterns from being fused by heat generated by the current flowing therethrough.

The drain 2 conductive pattern 2 should be formed such that the pattern can make connection with the drain 2 terminal 64 and the drain 2 control terminal 62 that is used for potential observation and, furthermore, electrically connects with drain electrodes provided on the back sides of power semiconductor chips 21 to 23 for the lower arm with solder joint layers 10 being put between the pattern and each electrode.

Gate electrode pads 501 of the power semiconductor chips 11 to 13 are electrically connected to a gate control terminal 91 by a bonding wire 31 formed to bridge each electrode pad and placed to contact each electrode pad.

In addition, apart from the bonding wires 35A, 35B, 35C which are the paths of the main current, a bonding wire 32 making connection among the source electrode pads 502 of the power semiconductor chips 11 to 13 is placed to electrically connect these pads to a source sense control terminal 92 of the power semiconductor module.

A current passing through the power semiconductor chips 21 to 23 for the lower arm flows from the source electrode pads 502 of the power semiconductor chips 21 to 23 via multiple bonding wires 45A, 45B, 45C to the source 2 conductive pattern 3 placed on the power semiconductor chip mounting substrate 100. The source 2 conductive pattern 3 should be formed such that the pattern can make connection with the source 2 terminals 63A, 63B.

In addition, the gate electrode pads 501 of the power semiconductor chips 21 to 23 are electrically connected to a gate control terminal 93 by a bonding wire 41 formed to bridge each electrode pad and placed to contact each electrode pad. Additionally, apart from the bonding wires 45A, 45B, 45C which are the paths of the main current, a bonding wire 42 making connection among the source electrode pads 502 of the power semiconductor chips 21 to 23 is placed to electrically connect these pads to a source sense control terminal 94 of the power semiconductor module.

In the present example, for directly connecting the gate electrode pads 501 and the source electrode pads 502, the abovementioned bonding wires 41, 42 formed to bridge each electrode pad are placed to contact each electrode pad without connection via wiring patterns; this means dispensing with the gate control wiring pattern and the source control wiring pattern (wiring patterns 3C and 3D) described in PTL 1 mentioned previously. As an effect, it is possible to realize a power semiconductor chip mounting substrate whose area has shrunk with a prescribed number of power semiconductor chips being mounted on the substrate. Alternatively, it is possible to increase the number of power semiconductor chips to be mounted on the substrate and the total chip area, while the prescribed area of the power semiconductor chip mounting substrate remains unchanged.

In the present example, like the bonding wire 31 connecting the gate electrode pads 501 of the power semiconductor chips 11, 12, 13, the bonding wire 32 connecting the source electrode pads 502 is provided. These bonding wires are placed near to each other with electrical insulation between them being ensured and characterized in that they are placed in substantially parallel with each other.

When switching occurs, the phases of a gate control current and a source control current for the power semiconductor chips are opposite. Switching produces an alternating current (AC) loop from the bonding wire 31, via the gate electrode pads 501 of the power semiconductor chips and the source electrode pads 502, to the bonding wire 32. By placing the bonding wires 31 and 32 in parallel with each other or setting them such that they are close to parallel, but slightly angled to each other, negative mutual inductance is generated between the bonding wires 31 and 32 and the loop inductance Lgloop of the AC current loop can be reduced.

Note that, in order to reduce the loop inductance Lgloop of the AC current loop effectively, it is required to keep an angle formed between the bonding wires 31 and 32 within 30 degrees. More preferably, wiring should be performed to place the bonding wire 32 along the bonding wire 31, keeping the angle between them within 20 degrees.

By reducing the loop inductance Lgloop, it can be achieved to reduce gate loop inductances of module internal paths viewed from the gate control terminal 91 or 93 and the source sense control terminal 92 or 94 of the power semiconductor module. It is possible to suppress resonance with a gate drive circuit (not depicted) of the power semiconductor module and suppress an oscillation noise voltage appearing in the voltage Vgs between the gate control terminal 91 or 93 and the source sense control terminal 92 or 94 when switching occurs.

Furthermore, in the present example, the bonding wires 31 and 32 are connected to the gate 1 control terminal 91 and the source sense 1 control terminal 92, respectively; these control terminals are situated on the resin casing 310 of the power semiconductor module. The bonding wires 41 and 32 are connected to the gate 2 control terminal 93 and the source sense 2 control terminal 94, respectively; these control terminals are situated on the resin casing 310 of the power semiconductor module. Thus, it is possible to realize the power semiconductor chip mounting substrate 100 whose area has shrunk without need to place dedicated conductive patterns on the power semiconductor chip mounting substrate 100. Thereby, along with further enhancing the effect of increasing the number of power semiconductor chips to be mounted on the substrate and the total chip area, it is possible to attain an effect of suppressing the oscillation noise voltage appearing in Vgs concurrently.

In addition, the structure of the present example depicted in FIG. 1 is characterized in that the source 2 conductive pattern 3 is placed between a region including the power semiconductor chips 11 to 13 for the upper arm and a region including the power semiconductor chips 21 to 23 for the lower arm. In a region surrounded by a dashed line in FIG. 1, the conductive patterns are placed so that a current flowing through the drain 2 conductive pattern 2 and a current flowing through the source 2 conductive pattern 3 will be parallel and adjacent to each other. Because the currents flowing through the conductive patterns 2 and 3 respectively flow in opposite directions, negative mutual inductance is generated and it can decrease a value of inductance that is generated in the region surrounded by a dashed line. Thereby, it is possible to reduce a noise voltage when switching occurs.

In other words, when taking up and viewing the region surrounded by a dashed line in FIG. 1, between a metal pattern 1 (the first conductive pattern) and a metal pattern 2 (the second conductive pattern), a metal pattern 3 (the third conductive pattern) is placed adjacently to the metal pattern 2 (the second conductive pattern). The directions of the currents flowing through the metal pattern 2 (the second conductive pattern) and the metal pattern 3 (the third conductive pattern) respectively differ from each other 180 degrees.

In addition, the source 2 conductive pattern 3 provides a distance between the gate wirings (31 and 41) and the source sense wirings (32 and 42) in the upper and lower arms of inverter legs; this is effective in that magnetic interference between them can be reduced.

Figure 1B:
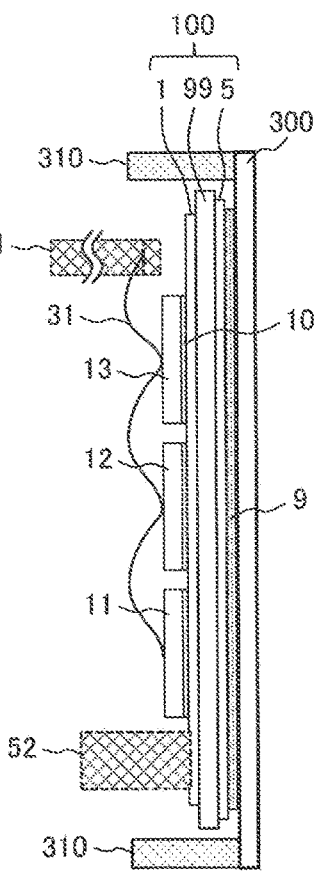

FIG. 1(b) depicts a cross-sectional diagram cut along the line A-A' which is a chain line drawn in the top view (a). In the cross-sectional diagram, an example of the wire 31 formed into convex bridges to bridge each electrode pad is presented. Its form is non-limiting as long as it realizes a function of making connection among the power semiconductor chips and insulation from other wirings on the power semiconductor chip mounting substrate 100 can be ensured. Namely, no limitation is intended to connection by the bonding wire and the use of a bonding ribbon or a narrow width conductor will also provide the same effect as the bonding wire.

Additionally, although the cross-sectional structure illustrates that the solder joint layer 9 is used for connecting the power semiconductor chip mounting substrate 100 with the base plate 300, the means for such connection is also non-limiting.

Figure 2:
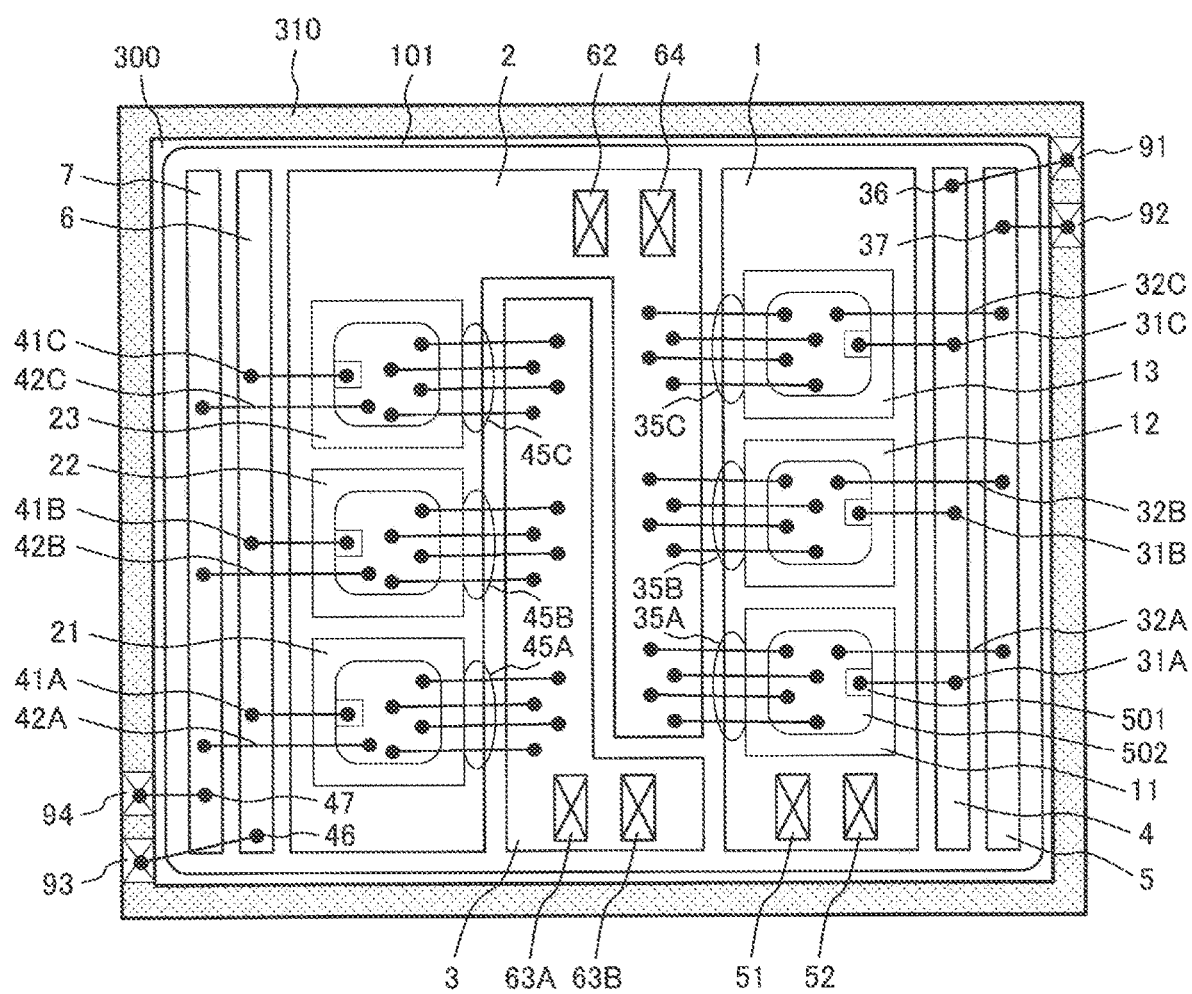
FIG. 2 is a diagram depicting an internal structure of a power semiconductor module of prior art.

FIG. 2 is a diagram depicting an internal structure of a power semiconductor module of prior art as a comparison example for making the structure of the present invention easy to understand. The number of power semiconductor chips depicted in FIG. 2 is equal to the number of power semiconductor chips mounted on the power semiconductor chip mounting substrate 100 in FIG. 1. In explanation of a power semiconductor chip mounting substrate 101 depicted in FIG. 2, e.g., as for the power semiconductor chips 11 to 13 for the upper arm, connection among their gate electrode pads 501 is made by placing a gate conductive pattern 4 and via bonding wires 31A, 31B, 31C. Similarly, connection among the source electrode pads 502 of the power semiconductor chips 11 to 13 is made by placing a source sense conductive pattern 5 and via bonding wires 32A, 32B, 32C.

These conductive patterns 4 and 5 are necessary for driving the gates of three power semiconductor chips illustrated in FIG. 2. Abutting with the locations of the power semiconductor chips that are placed, there must be areas for wiring of multiple bonding wires 31A to 31C and 32A to 32C concurrently.

For the power semiconductor chip mounting substrate 100 in the present example depicted in FIG. 1, its area can be reduced to 80% in comparison with the power semiconductor chip mounting substrate 101 of prior art depicted in FIG. 2. Note that, while the reduction rate as above depends on a design rule that is applied to a power semiconductor chip mounting substrate, it is apparent that the area reduction effect is obtained by the structure of the power semiconductor chip mounting substrate 100 illustrated in the present example (FIG. 1).

The present example depicted in FIG. 1 is an example where one type of power semiconductor chips, e.g., multiple MOSFET type power semiconductor chips with built-in diodes are mounted on the power semiconductor chip mounting substrate 100. Even in a case where two types of power semiconductor chips, e.g., IGBT chips and diode chips or IGBT chips and SBD chips are mounted, the effects explained in the present example can be obtained.

Particularly, in a case where power semiconductor chips of one type that allows for forward current flow and reflux (reverse) current flow, such as MOSFET type power semiconductor chips or IGBT type power semiconductor chips allowing for reverse current flow are used, the present invention would be effective to a large degree.

Therefore, it is preferable that each of the multiple power semiconductor chips 11 to 13 and 21 to 23 has both a current switching function and a refluxing function.

Note that, while, as depicted in FIG. 1, there are the feed points, one for each of the drain 1 terminal 51, the drain 2 terminal 64, and the source 2 terminal 63, it goes without saying that, according to a value of the current passing through the terminals, the number of the feed points for the terminals may be increased.

Figure 3:
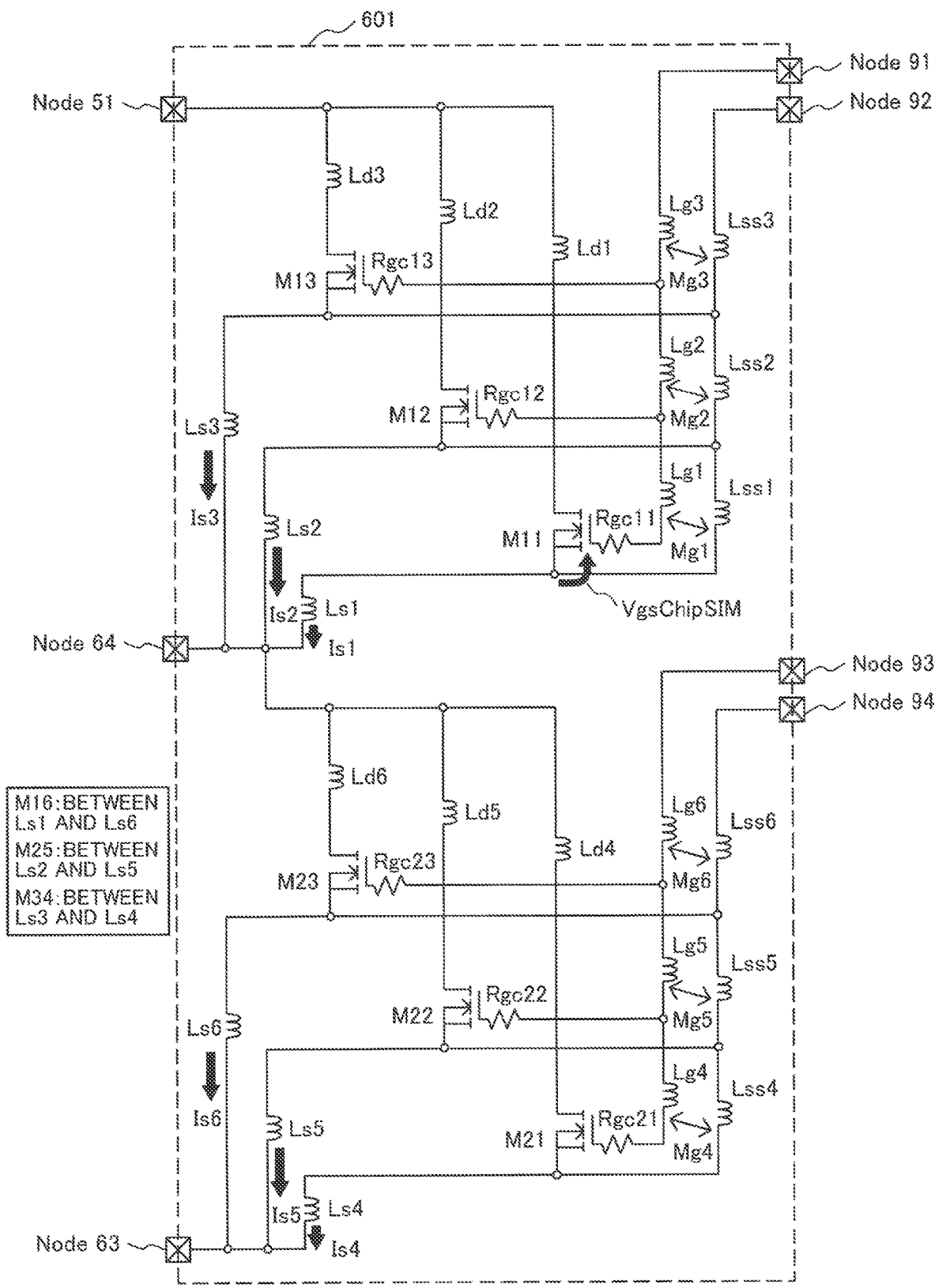
FIG. 3 is an equivalent circuit diagram of the power semiconductor module depicted in FIG. 1.

Next, it is now explained that the gate controllability of the power semiconductor module when switching occurs can be improved by using the present example. FIG. 3 is a simplified equivalent circuit 601 equivalent to the power semiconductor module depicted in FIG. 1. An upper arm circuit section and its structure are described below. The gates of three MOSFET symbols M11 to M13 representing the MOSFET type power semiconductor chips are connected via inductances Lg1 and Lg2 equivalent to a bonding wire and, similarly, their source senses are connected via inductances Lss1 and Lss2.

The gate of a MOSFET M13 is connected to a node 91 equivalent to the gate 1 control terminal 91 via an inductance Lg3. The source of the MOSFET M13 is connected to a node 92 equivalent to the source sense 1 control terminal 92. Because the bonding wires 31 and 32 depicted in FIG. 1 are placed in parallel with each other or close to parallel, but slightly angled to each other, mutual inductances are produced between the bonding wires 31 and 32.

In the equivalent circuit of FIG. 3, the mutual inductances are represented by Mg1 to Mg3 which are set between the inductances Lg1 and Lss1, between the inductances Lg2 and Lss2, and between the inductances Lg3 and Lss3. Because the mutual inductances are negative, they can reduce the loop inductance Lgloop of the abovementioned AC current loop through the gates. Connection between a node 51 (equivalent to the drain feed point 51 in FIG. 1) and each of the drains of the MOSFETS M11 to M13 is made via inductances Ld1 to Ld3 which represent impedances that are generated in the drain 1 conductive pattern 1 on the power semiconductor chip mounting substrate 100 in FIG. 1.

In addition, connection between a node 64 (equivalent to the source feed point 64 in FIG. 1) and each of the sources of the MOSFETS M11 to M13 is made via inductances Ls1 to Ls3 which represent impedances that are generated in the source bonding wires 35A to 35C and the drain 2 conductive pattern 2 on the power semiconductor chip mounting substrate 100 in FIG. 1. For a lower arm circuit section in which MOSFET symbols M21 to M23 are switching elements, its structure is the same as the upper arm circuit section and its detailed description is skipped.

Note that, in the region surrounded by a dashed line in FIG. 1, mutual inductances that are generated by placing the drain 2 conductive pattern 2 and the source 2 conductive pattern 3 in parallel and adjacently to each other are included as M16, M25, M34 in the equivalent circuit. Although the impedances of the bonding wires and the conductive patterns are represented by inductance symbols, such representation is not depicted in a simulation circuit which will be described later; however, the influence of parasitic resistance is also taken into consideration in the simulation circuit.

In addition, in the equivalent circuit of FIG. 3, resistors Rgc11 to Rgc13 and Rgc21 to Rgc23 are placed in series to the respective gates of the MOSFETS. Although not depicted in FIG. 1, these resistors are the built-in gate resistors of the power semiconductor chips and the effect thereof will be described later.

Note that arrow marks Is1 to Is6 in FIG. 3 indicate the direction of the current flowing through parasitic inductances Ls1 to Ls6 of the MOSFET source main current paths respectively. Additionally, VgsChipSIM denotes the gate to source voltage of a power semiconductor chip.

Figure 4:
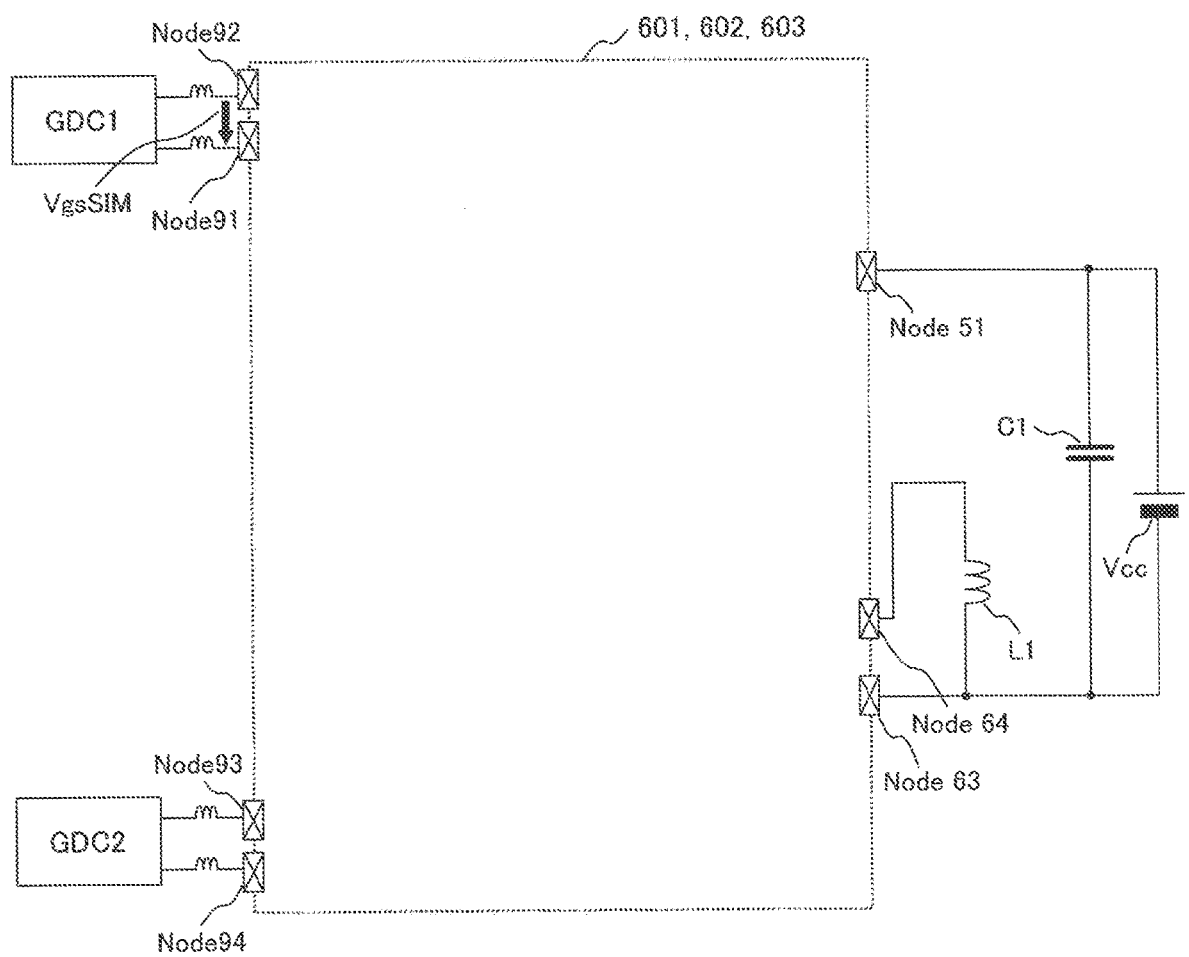
FIG. 4 is an overview diagram of a computational circuit for verifying advantageous effects of the present invention.

FIG. 4 is a simulation circuit configured with the equivalent circuit 601 of the 2in1 power semiconductor module depicted in FIG. 3 and its gate drive circuits (GDC1, GDC2), an inductive load L1, a power supply Vcc, and a power supply stabilizing capacitor C1. The nodes 91 to 94, the node 51, the node 63, and the node 64 in the simplified equivalent circuit 601 of FIG. 3 are wired to the above elements of the simulation circuit.

Switching transient waveforms obtained by circuit simulation are presented in FIG. 5. A graph (a)-1 in FIG. 5 is a transient response waveform that results from driving the gate control terminal 91 and the source sense control terminal 92 in the upper arm circuit section of the equivalent circuit 601 by the gate drive circuit GDC1 in the simulation circuit depicted in FIG. 4.

A solid line in FIG. 5(*a*) represents the waveform of a voltage VgsSIM between the gate control terminal 91 and the source sense control terminal 92 and a dashed line represents the waveform of the gate to source voltage VgsChipSIM (see FIG. 5) of a MOSFET M11 included in the equivalent circuit 601 (FIG. 3). Here are the waveforms when the MOSET is turned on and those during changing from an off drive voltage VGSN to an on drive voltage VGSP of the GDC1. An enlarged view around a gate plateau voltage that becomes the most important when switching occurs is presented in FIG. 5(*a*)-2.

It is obvious that the VgsSIM waveform that can be observed as a voltage between terminals of the power semiconductor module satisfactorily replicates the gate to source voltage VgsChipSIM of a power semiconductor chip on the chip mounting substrate 100 incorporated in the module. By realizing such satisfactory replication, after installing the power semiconductor module in a power converter, it is enabled to implement drive control, such as optimizing adjustment of the dv/dt and di/dt values and loss based on transient waveforms obtained at the gate drive terminals (including the gate control terminal and the source sense control terminal) of the power semiconductor module, without providing unnecessary margins.

Figure 6:
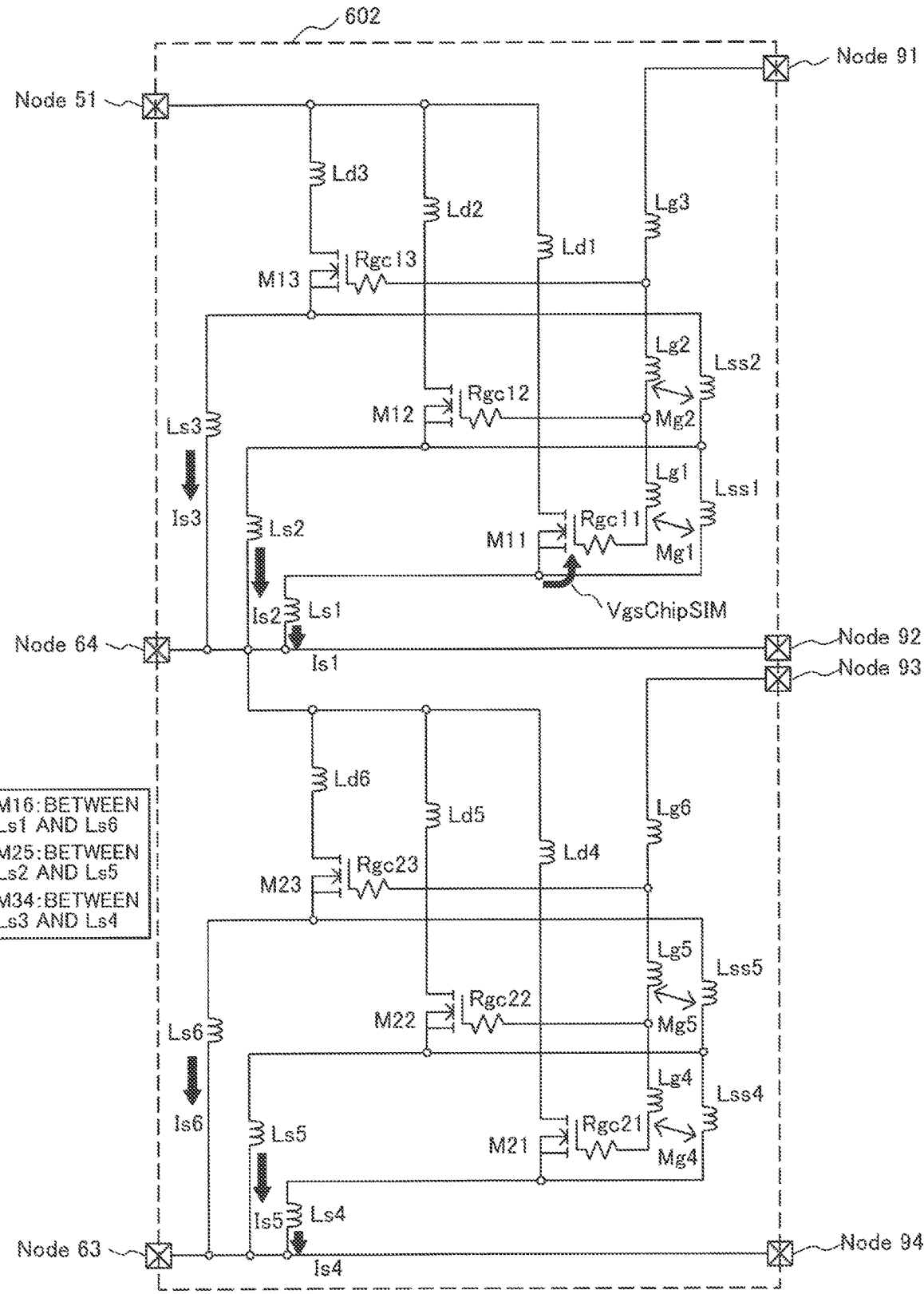
FIG. 6 is an equivalent circuit diagram of a power semiconductor module of prior art.

An equivalent circuit 602 of FIG. 6 is a circuit for comparison with the equivalent circuit 601 depicted in FIG. 3. The equivalent circuit 602 is the same as the equivalent circuit 601 in the aspect in which the gates of the MOSFET type power semiconductor chips M11 to M13 are connected via inductances Lg1 and Lg2 and their source senses are connected via inductances Lss1 and Lss2. However, the equivalent circuit 62 is an example where the node 64 through which the main current passes (equivalent to the terminal 64 in FIG. 1) also serves as the node 92, i.e., the contact at which a source sense control voltage is acquired. As for the lower arm circuit section of the equivalent circuit 602, the same change is also made as in the upper arm circuit section.

Switching transient waveforms are presented in FIG. 5(*b*)-1 and FIG. 5(*b*)-2. As with FIG. 5(*a*), here are the waveforms when the MOSFET is turned on and those during changing from the off drive voltage VGSN to the on drive voltage VGSP of the GDC1. In FIG. 5(*b*)-2, it is obvious that an oscillation is generated in the voltage (VgsSIM) between the gate control terminal 91 (the node 91 in the equivalent circuit) and the source sense control terminal 92 (the node 92 in the equivalent circuit), which is represented by a solid line, whereas substantially no oscillation is found in the gate to source voltage VgsChipSIM of a MOSFET M11 included in the equivalent circuit 602.

In other words, it is indicated that a noise voltage (oscillation voltage) is superimposed on the voltage between the gate control and source sense control terminals of the power semiconductor module, appearing different from the transient waveform of the gate to source voltage of a power semiconductor chip mounted on the chip mounting substrate in the module.

Figure 7:
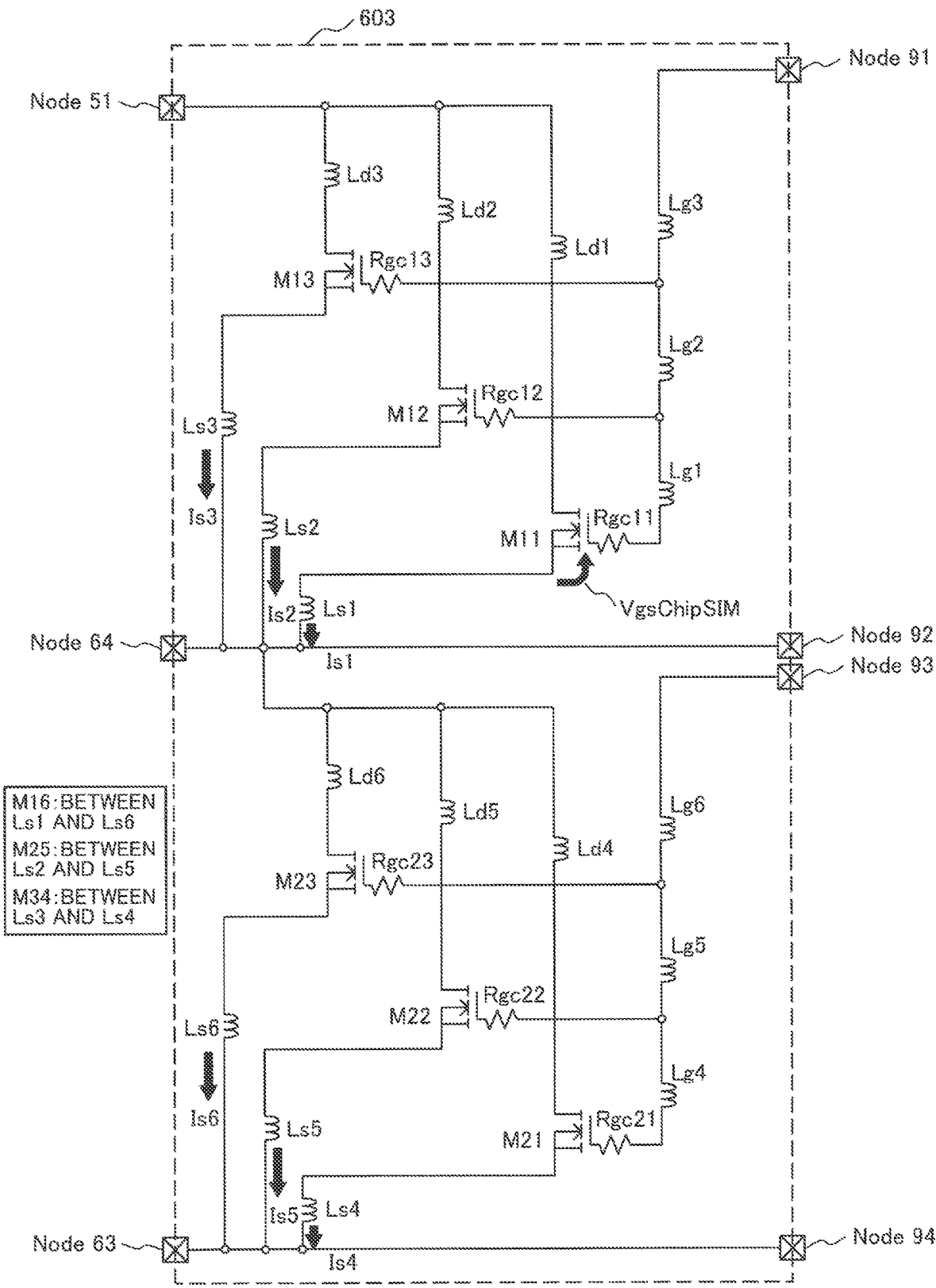
FIG. 7 is an equivalent circuit diagram of a power semiconductor module of prior art.

As with FIG. 6, an equivalent circuit 603 of FIG. 7 is also a circuit for comparison with the equivalent circuit 601. In comparison with the equivalent circuit 601, in the equivalent circuit 603, the gates of the MOSFET type power semiconductor chips M11 to M13 are connected via inductances Lg1 and Lg2, whereas the source sense path across each chip is removed. This wiring disables the effect of wiring the source electrodes across the chips illustrated in the circuitry of FIG. 1 and the equivalent circuit of FIG. 3.

The node 64 through which the main current passes (equivalent to the terminal 64 in FIG. 1) also serves as the node 92, i.e., the contact at which the source sense control voltage is acquired. As for the lower arm circuit section of the equivalent circuit 603, the same change is also made as in the upper arm circuit section.

Switching transient waveforms are presented in FIG. 5(*c*)-1 and FIG. 5(*c*)-2. As with FIG. 5(*b*) above, in FIG. 5(*c*)-1 and FIG. 5(*c*)-2, it is obvious that an oscillation is generated in the voltage (VgsSIM) between the gate control terminal 91 and the source sense control terminal 92, which is represented by a solid line, whereas substantially no oscillation is found in the gate to source voltage VgsChipSIM of a MOSFET M11 included in the equivalent circuit of the substrate.

For the equivalent circuit 603 of FIG. 7 as well, it is indicated that a noise voltage (oscillation voltage) is superimposed on the voltage between the gate control and source sense control terminals of the power semiconductor module, appearing different from the transient waveform of the gate to source voltage of a power semiconductor chip mounted on the chip mounting substrate in the module.

In other words, for both the waveforms in FIG. 5(*b*) and FIG. 5(*c*), it is indicated that a waveform different from the transient waveform of the gate to source voltage VgsChip of a power semiconductor chip mounted on the power semiconductor chip mounting substrate in the module appears in the voltage Vgs that can be observed between the gate control and source sense control terminals of the power semiconductor module.

Essentially, it is required to optimize the gate drive speed within a voltage range not exceeding the gate rated voltage based on transient waveforms appearing in VgsChip and take advantage of characteristics specific to power semiconductor chips. In a case where a difference arises between the transient waveforms of VgsChip and Vgs that can be observed, as noted above, the gate drive speed is to be optimized depending on the Vgs waveform that can be observed.

Consequently, even though power semiconductor chips are intrinsically operable at high speed, a moderate gate drive speed has to be selected according to the Vgs waveform. Switching loss would increase and it would become difficult to take advantage of characteristics specific to power semiconductor chips.

On the other hand, according to the connection configuration among the chips and to the gate control and source sense control terminals on the power semiconductor chip mounting substrate illustrated in the present example, it is possible to configure the power semiconductor module to take full advantage of performance of power semiconductor chips, overcoming the problem noted above.

As described in the foregoing context, it is apparent that, according to the present example, it is possible to improve the efficiency of mounting multiple power semiconductor chips on the power semiconductor chip mounting substrate (the main substrate) that is incorporated in the power semiconductor module and, concurrently, to improve the gate controllability of the power semiconductor module when switching occurs.

In the equivalent circuit diagram of FIG. 3, the resistors Rgc11 to Rgc13 are placed in series to the gates of the MOSFET type transistors M11 to M13. The effect about this is descried below.

Parallel bonding connections among the gate electrodes and among the source electrodes of the multiple chips depicted in FIG. 1 can improve the efficiency of mounting chips on the power semiconductor chip mounting substrate or realize area shrinkage of the power semiconductor chip mounting substrate. Moreover, in order to enhance the reliability of the mounted power semiconductor chips and prolong the life of the power semiconductor module, history of heat stress with respect to the power semiconductor chips and wiring component materials including bonding wires and solder as structures to wire the chips should be made as even as possible.

The previously mentioned built-in gate resistors Rgc of the power semiconductor chips are applied to make the current balance among the power MOSFET chips as even as possible when switching occurs and equalize the heat history with respect to the power semiconductor chips and wiring component materials around the chips.

Figure 8:
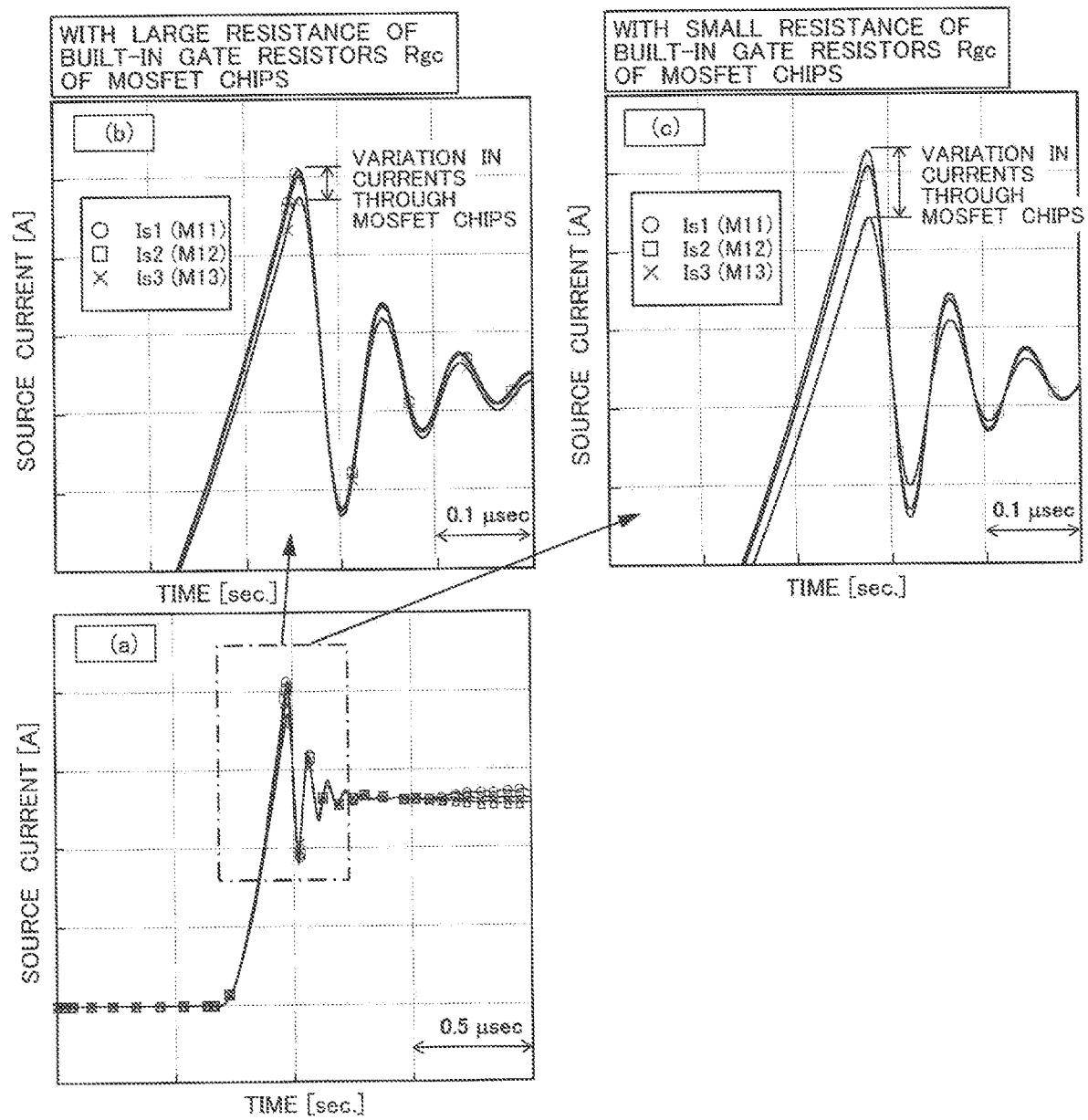
FIG. 8 is a set of diagrams illustrating an example of advantageous effects of the present invention.

FIG. 8 represents circuit simulation results from increasing and decreasing the resistance values of the built-in gate resistors Rgc11 to Rgc13 of the MOSFETs M11 to M13 and the built-in gate resistors Rgc21 to Rgc23 of the MOSFETs M21 to M23 in the equivalent circuit, using the switching simulation circuit of FIG. 4.

FIG. 8 represents transient waveforms of the drain currents of the power MOSFET chips when they are turned on. FIG. 8($a$) presents general waveforms, FIG. 8($b$) presents waveforms when resistance of the resistors Rgc11 to Rgc13 and Rgc21 to Rgc23 was set to a large value, e.g., 32Ω, and FIG. 8($c$) presents waveforms when resistance of the resistors Rgc11 to Rgc13 and Rgc21 to Rgc23 was set to a small value, e.g., 2Ω.

It is obvious that use of the parallel bonding connections among the gate electrodes and among the source electrodes of the multiple chips causes unevenness of impedances of paths viewed from the gate drive circuit GDC1 to the gate electrodes and the source electrodes of the power semiconductor chips.

Therefore, the placement of the foregoing built-in gate resistors Rgc with a suitable resistance value dampens the unevenness of impedances and converges the current conduction timings of the power semiconductor chips.

Comparison between FIG. 8($b$) and FIG. 8($c$) clarifies that, by setting the resistance of the resistors Rgc to a predefined value or more, it is possible to reduce variation in the currents through the power MOSFET chips when switching occurs to below a certain level.

As described in the foregoing context, the power semiconductor module of the present example includes the following; the insulated substrate 99; the first conductive pattern (metal pattern 1) laid out on the insulated substrate 99; the multiple power semiconductor chips 11 to 13 arranged on the first conductive pattern (metal pattern 1); the first wiring (bonding wire 31) formed to bridge each electrode pad and directly connecting the respective gate electrodes (gate electrode pads 501) of the multiple power semiconductor chips 11 to 13; and the second wiring (bonding wire 32) formed to bridge each electrode pad and directly connecting the respective source electrodes (source electrode pads 501) of the multiple power semiconductor chips 11 to 13. The first wiring (bonding wire 31) is placed alongside of the second wiring (bonding wire 32) and may be angled within 30 degrees with respect to the second wiring (bonding wire 32).

The power semiconductor module also includes the gate control terminal 91 placed, electrically insulated from the first conductive pattern (metal pattern 1), and the source sense control terminal 92 placed separating away from the first conductive pattern (metal pattern 1). The first wiring (bonding wire 31) is connected to the gate control terminal 91 and the second wiring (bonding wire 32) is connected to the source sense control terminal 32.

In addition, the multiple power semiconductor chips 11 to 13 arranged on the first conductive pattern (metal pattern 1) and the multiple power semiconductor chips 21 to 23 arranged on the second conductive pattern (metal pattern 2) are disposed in point symmetrical positions.

In addition, each of the multiple power semiconductor chips 11 to 13 and 21 to 23 is provided with a built-in resistor having a predefined resistance value to act upon impedances of chip internal paths viewed from the gate electrode pads 501. Note that each of the multiple power semiconductor chips 11 to 13 and 21 to 23 is provided with a built-in resistor made of polysilicon, which is favorable for size reduction of the power semiconductor module. Built-in resistors made of polysilicon are easy to form on the semiconductor chips and less dependent on temperature.

Consequently, it is possible to realize a power semiconductor module in which multiple semiconductor chips are arranged in parallel on an insulated substrate, wherein the above module allows for high density mounting of semiconductor chips and is highly reliable with less difference in operating characteristics from one semiconductor chip to another.

Furthermore, both size reduction and reliability improvement of a power converter using this power semiconductor module are achievable.

Example 2

A power semiconductor module of Example 2 of the present invention is described with reference to FIG. 9.

Here is depicted the internal structure of a 2in1 module in which MOSFET type power semiconductor chips are mounted, as is the case for Example 1 (FIG. 1). Its cross-sectional structure is also the same as in FIG. 1($b$) and, therefore, it is not depicted here again.

On a power semiconductor chip mounting substrate 102, power semiconductor chips for an upper arm of the 2in1 module and power semiconductor chips for a lower arm are mounted together. A drain 1 terminal 51 which is a high potential terminal (P terminal) of the 2in1 module is connected to a drain 1 feed point 51 of the power semiconductor chip mounting substrate 102. A drain 2 terminal 64 which is an intermediate potential terminal (AC terminal) is connected to a drain 2 feed point 64 of the power semiconductor chip mounting substrate 102. Source 2 terminals 63 which are low potential terminals (N terminals) are connected to source 2 feed points 63 of the power semiconductor chip mounting substrate 102.

A drain sense 1 control terminal 52 is connected to a drain sense 1 feed point 52 and a drain sense 2 control terminal 62 is connected to a drain sense 2 feed point 62; these terminals are used for observing a drain voltage in the upper and lower arms. In the way described above, the terminals of the power semiconductor module are electrically connected with the power semiconductor chip mounting substrate.

This example illustrates a case of mounting a larger number of power semiconductor chips to increase the rated current of the power semiconductor module or increase the total area occupied by the mounted power semiconductor chips within a prescribed module area.

Figure 9:
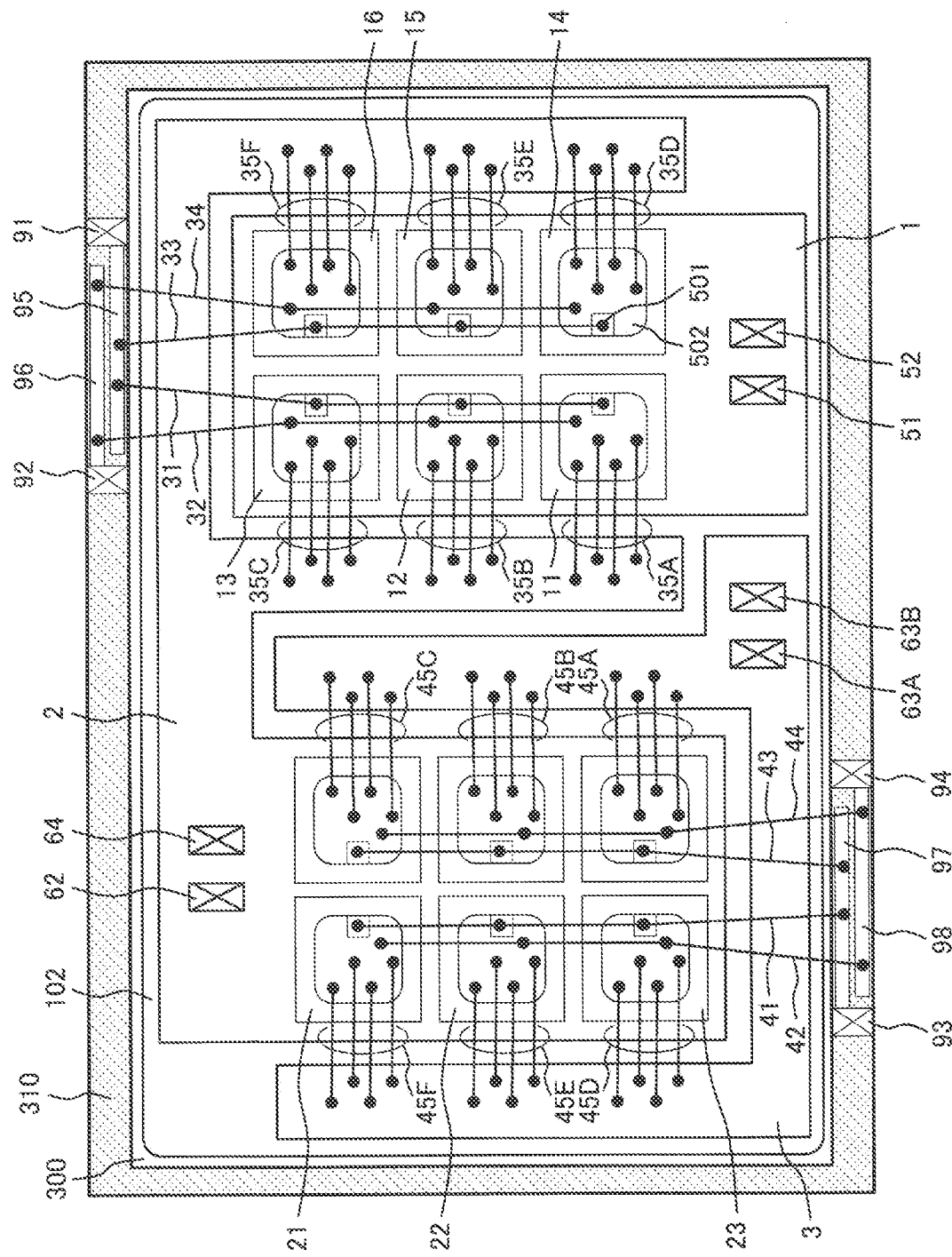
FIG. 9 is a diagram depicting an internal structure of a power semiconductor module pertaining to Example 2 of the present invention.

As depicted in FIG. 9, power semiconductor chips 11 to 16 operating as switching elements in an upper arm circuit section are organized into groups, each including three chips. Across chips in one group, electrical connections among their gate electrodes and among their source electrodes are made using wiring formed to bridge each electrode pad. Power semiconductor chips 21 to 26 operating as switching elements in a lower arm circuit section are also organized into groups, each including three chips. Across chips in one group, electrical connections among their gate electrodes and among their source electrodes are made using wiring formed to bridge each electrode pad.

Taking the upper arm circuit section as an example, descriptions are provided for characteristics of the present example. In the upper arm circuit section, a first chip group includes power semiconductor chips 11 to 13 and a second chip group includes power semiconductor chips 14 to 16. Across the chips in the first and second chip groups, wiring among the gate electrodes and wiring among the source electrodes are configured as described in the section of Example 1.

A configuration characteristic of the present example is such that the lines of wiring among the gate electrodes in the first and second chip groups are electrically interconnected by a conductor 95 placed on or embedded in the resin casing 310. Likewise, the lines of wiring among the source electrodes are electrically interconnected by a conductor 96 placed on or embedded in the resin casing 310.

Such electrical connection is conventionally provided using conductive patterns laid out on the same chip mounting substrate and the conductive patterns have been a factor in increasing the area of the power semiconductor chip mounting substrate or preventing the increase in the number of chips to be mounted.

Accordingly, adoption of the configuration of the present example makes it possible to prevent the substrate area from increasing even in a case where multiple power semiconductor chips are mounted in two columns in parallel, in addition to the advantageous effects of the present invention described in the section of Example 1.

For the upper arm circuit section, drive signals can be supplied to the gate electrodes of the power semiconductor chips 11 to 16 by the gate 1 control terminal 91 electrically connected with the conductor 95 and the source sense 1 control terminal 92 electrically connected with the conductor 96.

Similarly, for the lower arm circuit section as well, drive signals can be supplied to the gate electrodes of the power semiconductor chips 21 to 26 by the gate 1 control terminal 93 electrically connected with a conductor 97 and the source sense 1 control terminal 94 electrically connected with a conductor 98.

In comparison with the corresponding module structure of prior art, the area of the base of the power semiconductor module that adopts the present example can be reduced to 83%.

Note that, while the reduction rate as above depends on a design rule that is applied to a power semiconductor chip mounting substrate, it is apparent that the area reduction effect is obtained by the structure of the power semiconductor chip mounting substrate illustrated in Example 2.

As described above, in the power semiconductor module of the present example, multiple power semiconductor chips 11 to 16 are arranged in multiple chip groups, each including a given number of chips, on the conductive pattern (metal pattern 1). The first wiring (bonding wires 31, 33) of the respective chip groups are connected to a common gate control terminal 91 and the second wiring (bonding wires 32, 34) of the respective chip groups are connected to a common source sense control terminal 92.

In the present example, an example is illustrated where the upper and lower arm circuit sections have an equal number of power semiconductor chips, a chip group includes three chips, and there are two chip groups. Even if the number of chips belonging to each chip group and the number of chip groups differ from those depicted, the advantageous effects of the present invention can be obtained. For instance, even if two chip groups are arranged adjacently to each other and each chip group includes a different number of chips, advantageous effects of the present invention can be obtained. This is also true even if the number of chip groups existing in each arm circuit section is three or more.

Example 3

Figure 10:
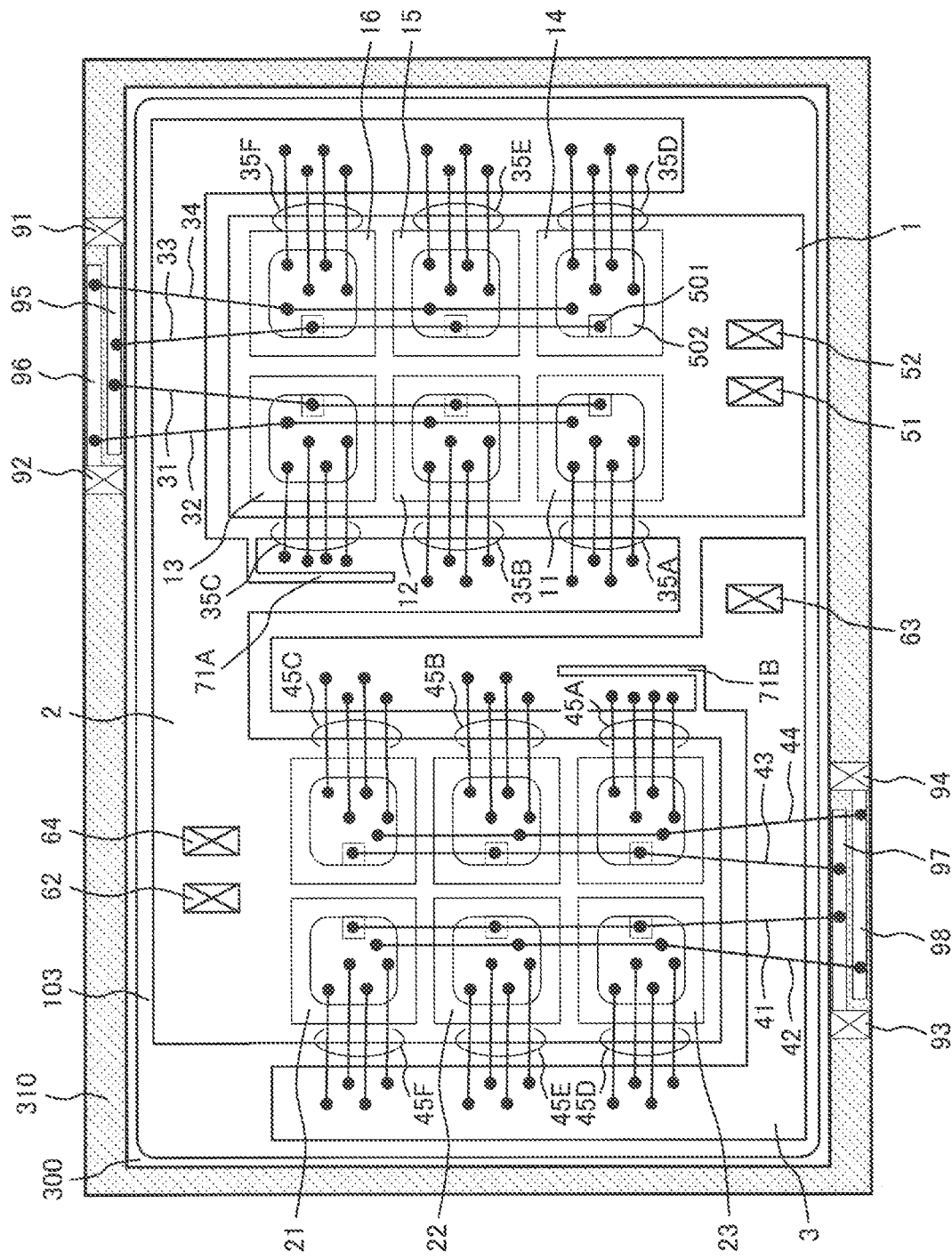
FIG. 10 is a diagram depicting an internal structure of a power semiconductor module pertaining to Example 3 of the present invention.

A power semiconductor module of Example 3 of the present invention is described with reference to FIG. 10. The power semiconductor module depicted in FIG. 10 includes slit patterns 71A and 71B formed in place respectively in the drain 2 conductive pattern 2 and the source 2 conductive pattern 3 formed on the power semiconductor chip mounting substrate 103. The slit patterns 71A and 71B are disposed in point symmetric positions to each other.

A slit pattern 71A reduces unbalance in inductances of the paths of the source main current that flows from the source electrode pads of multiple MOSFET type power semiconductor chips 11 to 13 via multiple bonding wires 35A, 35B, 35C and flows into the drain 2 feed point 64 connected to the intermediate potential (AC) terminal.

A path of the source current flowing out from a power semiconductor chip 13 through the drain 2 conductive pattern 2 to the drain 2 feed point 64 is the shortest and such path from a power semiconductor chip 11 is the longest. The slit pattern 71A formed in place in the drain 2 conductive pattern 2, as depicted in FIG. 10, is formed in inverted L shape in place to detour the current path from the power semiconductor chip 13 that is nearest to the drain 2 feed point 64. Introduction of the slit 71A makes it possible to reduce variation in inductances of the source current paths from the power semiconductor chips 11 to 13.

Similarly, the power semiconductor chips 14 to 16 are also bonding wires 35D, 35E, 35F to the drain 2 feed point 64 connected to the intermediate potential (AC) terminal. Nevertheless, in the drain 2 conductive pattern 2, a slit pattern is not formed in place for the power semiconductor chips 14 to 16. The power semiconductor chips 14 to 16 are disposed far away electrically as compared with the power semiconductor chips 11 to 13 and, therefore, a slit pattern that further increases inductance is not applied.

The above description concerns the upper arm circuit section. The function of a slit pattern 71B formed in place in the source 2 conductive pattern 3 is the same as above and, therefore, its description is omitted.

Note that, although the slit patterns formed in inverted L shape have been illustrated as an example of their shape, an advantageous effect of the present example can be obtained with L-shaped or I-shaped slit patterns or the like within a range that does not deviate from the above description.

As described in the foregoing context, in the power semiconductor module of the present example, the second conductive pattern (metal pattern 2) is connected with the source electrode pads 502 of the multiple power semiconductor chips 11 to 13 on the first conductive pattern (metal pattern 1) by the multiple bonding wires 35A, 35B, 35C and has the first slit pattern 71A formed in L shape or I shape to reduce variation in inductances of the source current paths between connection points at which the bonding wires 35A, 35B, 35C connect with the second conductive pattern (metal pattern 2) and the feed point 64 on the second conductive pattern (metal pattern 2). In addition, the third conductive pattern (metal pattern 3) is connected with the source electrodes of the multiple power semiconductor chips on the second conductive pattern (metal pattern 2) by the multiple bonding wires 45A, 45B, 45C and has the second slit pattern 71B formed in L shape or I shape to reduce variation in inductances of the source current paths between connection points at which the bonding wires 45A, 45B, 45C connect with the third conductive pattern (metal pattern 3) and the feed point 63 on the third conductive pattern (metal pattern 3).

The structure of the power semiconductor chip mounting substrate 103 of the present example applying the slit patterns 71A and 71B makes it possible to improve current balance among the mounted power semiconductor chips, as compared with the structure of the power semiconductor module illustrated in the section of Example 2 (FIG. 9).

According to each example of the preset invention described hereinbefore, the power semiconductor module has the internal structure that makes it possible to improve the efficiency of mounting power semiconductor chips on the power semiconductor chip mounting substrate and shrink the area of the power semiconductor chip mounting substrate or increase the number of power semiconductor chips to be mounted on the substrate with a prescribed area.

Concurrently, the structure of the present invention makes it possible to decrease the difference between the gate drive voltage observed at the gate drive terminals of the semiconductor module and the waveform of the gate drive voltage for the power semiconductor chips mounted in the power semiconductor module. Advantageous effects noted above enable the size reduction of a power semiconductor module on which, particularly, compound semiconductor chips of high performance, but with a smaller chip area, are mounted or the realization of a high current power semiconductor module by realization of mounting a larger number of chips. At the same time, it is enabled to set the gate drive waveform at high speed or at a voltage as large as possible, while suppressing a noise voltage which is produced by switching within a rated gate voltage range of the power semiconductor chips. It is possible to provide a power semiconductor module that enables it to take full advantage of performance of the power semiconductor chips.

Specifically, the internal structure of the power semiconductor module enables the realization of high speed switching with multiple power semiconductor chips being arranged in parallel. Consequently, it is possible to enhance the performance of a power semiconductor module with compound semiconductor chips made of SiC (silicon carbide) or GaN (gallium nitride) being mounted thereon, the chip area of those chips being smaller because of lower chip yield than Si semiconductor chips; namely, the rated current value of the module is allowed to increase, whereas switching loss can be reduced.

Note that the present invention would become more effective when applied to compound semiconductor chips that are smaller in shape, since their chip yield is low because of crystal defects originating from a substrate and manufacturing process issues. Particularly, in the case of application to SiC power MOSFET chips of a vertical structure manufactured using a SiC substrate, because the chips also have a reflux diode function, only one type of Sic power MOSFET chips are to be mounded on the chip mounting board and, therefore, higher chip mounting efficiency can be obtained.

Note that the present invention is not limited to the examples described hereinbefore and various modifications are included therein. For example, the foregoing examples are those described in detail to explain the present invention clearly and the invention is not necessarily limited to those including all components described. In addition, a subset of the components of an example may be replaced by components of another example and components of another example may be added to the components of an example. In addition, for a subset of the components of each example, other components may be added to the subset or the subset may be removed or replaced by other components.

Advantageous effects of the present invention remain unchanged, for instance, even if the switching elements were changed from the MOSFET type (MOS Field Effect Transistors) used in the examples herein to either unipolar devices of J-FET type (Junction Field Effect Transistors) or bipolar devices like IGBT type (Insulated Gate Bipolar Transistors) and, moreover, the functions of the terminals were interchanged, e.g., changing drain to collector, source to emitter, and gate to base. Also, likewise for diode elements, it is obvious that advantageous effects of the present invention remain unchanged even if either PN junction diodes or SB (Schottky junction) diodes are used.

REFERENCE SIGNS LIST

1 to 7: metal (conductive) patterns on the insulated substrate, 9, 10: solder joint layers,
11 to 16, 21 to 26: power semiconductor chips,
31 to 34, 35A to 35C, 41 to 44, 45A to 45C: bonding wires
36, 46: wires for wiring the gates,
37, 47: wires for wiring the sources,
51, 63A, 63B, 64: terminals (feed points for terminals on the substrate),
52, 62: terminals (feed points for monitoring potential on the substrate),
71A, 71B; slit patterns,
91, 93: gate control terminals,
92, 94: source sense control terminals,
95, 97: conductors (for gate connection among chips),
96, 98: conductors (for source sense connection among chips),
99: insulated substrate,
100 to 103: power semiconductor chip mounting substrate,
300: base plate,
310: resin casing,
501: gate electrode pad (of a power semiconductor chip),
502: source electrode pad (of a power semiconductor chip),
601, 602, 603: (simplified) equivalent circuits,
$Mg1$ to $Mg6$, $M16$, $M25$, $M34$: mutual inductances,
$Ld1$ to $Ld6$: parasitic inductances of MOSFET drain paths, Ls1 to Ls6: parasitic inductances of MOSFET source main current paths,
Lg1 to Lg6: parasitic inductances of MOSFET gate paths,
Lss1 to Lss6: parasitic inductances of MOSFET source control paths,
Rgc11 to Rgc13, Rgc21 to Rgc23: values of resistors on gate paths internal to MOSFET chips.

The invention claimed is:

1. A power semiconductor module comprising:
an insulated substrate;
a first and a second conductive patterns and laid out on the insulated substrate;
multiple power semiconductor chips arranged on the first and second conductive patterns, wherein each of the multiple power semiconductor chips on the first and second conductive patterns comprises a gate electrode and a source electrode;
a first wiring formed to bridge and directly connecting respective gate electrodes of the multiple power semiconductor chips;
a second wiring formed to bridge and directly connecting respective source electrodes of the multiple power semiconductor chips;
a gate control terminal electrically insulated from the first conductive pattern and situated on a casing; and
a source sense control terminal spaced from the first conductive pattern and situated on the casing,
wherein the first wiring is connected to the gate control terminal, and the second wiring is connected to the source sense control terminal,
wherein the second conductive pattern is connected with the source electrodes of multiple power semiconductor chips on the first conductive pattern by multiple bonding wires,
wherein an angle formed between the first wiring and the second wiring is 30 degrees or less and the first wiring is connected to the gate control terminal without connection to the second conductive pattern on the insulated substrate; and
the second wiring is connected to the source control terminal without connection to the first conductive pattern on the insulated substrate.

2. The power semiconductor module according to claim 1, wherein the multiple power semiconductor chips are arranged in multiple chip groups on the first conductive pattern;
the first wiring of the respective chip groups are connected to a common gate control terminal; and
the second wiring of the respective chip groups are connected to a common source sense control terminal.

3. The power semiconductor module according to claim 1, further comprising:
a third wiring formed to bridge and directly connecting respective gate electrodes of the multiple power semiconductor chips on the second conductive pattern; and
a fourth wiring formed to bridge and directly connecting respective source electrodes of the multiple power semiconductor chips on the second conductive pattern;
wherein the third wiring is placed alongside of the fourth wiring and is angled within 30 degrees with respect to the fourth wiring.

4. The power semiconductor module according to claim 3, wherein between the first conductive pattern and the second conductive pattern, a third conductive pattern is placed adjacently to the second conductive pattern; and
currents flowing through the first conductive pattern and the second conductive pattern respectively flow in opposite directions.

5. The power semiconductor module according to claim 4, wherein the second conductive pattern is connected with the source electrodes of multiple power semiconductor chips on the first conductive pattern by multiple bonding wires, wherein each of the source electrodes is connected to a source feed point on the second conductive pattern, and has a first slit pattern formed in L shape or I shape to reduce variation in inductances of source current paths between connection points at which the bonding wires connect with the second conductive pattern and a feed point on the second conductive pattern; and
the third conductive pattern is connected with the source electrodes of multiple power semiconductor chips on the second conductive pattern by multiple bonding wires, wherein each of the source electrodes is connected to a source feed point on the third conductive pattern, and has a second slit pattern formed in L shape or I shape to reduce variation in inductances of source current paths between connection points at which the bonding wires connect with the third conductive pattern and a feed point on the third conductive pattern.

6. The power semiconductor module according to claim 5, wherein the first slit pattern and the second slit pattern are disposed catercorner to each other.

7. The power semiconductor module according to claim 1, wherein each of the multiple power semiconductor chips has both a current switching function and a reflux function.

8. The power semiconductor module according to claim 1, wherein each of the multiple power semiconductor chips on the first and second conductive patterns includes a gate electrode pad and a built-in resistor, the built-in resistor having a predefined resistance value to act upon impedances of chip internal paths that occur in the gate electrode pads.

9. The power semiconductor module according to claim 8, wherein the built-in resistor made of polysilicon.

10. The power semiconductor module according to claim 1, wherein the multiple power semiconductor chips are SiC power semiconductor chips.

* * * * *